(12) United States Patent
Chen

(10) Patent No.: US 12,113,119 B2
(45) Date of Patent: Oct. 8, 2024

(54) FIELD EFFECT TRANSISTOR, PREPARATION METHOD THEREOF AND INTEGRATED CIRCUIT

(71) Applicant: HON HAI PRECISION INDUSTRY CO., LTD., New Taipei (TW)

(72) Inventor: Chung-Yi Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 155 days.

(21) Appl. No.: 17/573,852

(22) Filed: Jan. 12, 2022

(65) Prior Publication Data

US 2023/0069273 A1    Mar. 2, 2023

(30) Foreign Application Priority Data

Sep. 1, 2021 (CN) .......................... 202111020044.7

(51) Int. Cl.
| | |
|---|---|
| *H01L 29/76* | (2006.01) |
| *H01L 29/06* | (2006.01) |
| *H01L 29/66* | (2006.01) |
| *H01L 29/78* | (2006.01) |
| *H01L 29/94* | (2006.01) |

(52) U.S. Cl.
CPC .... *H01L 29/66795* (2013.01); *H01L 29/0649* (2013.01); *H01L 29/7848* (2013.01)

(58) Field of Classification Search
CPC ........... H01L 29/66795; H01L 29/0649; H01L 29/7848; H01L 29/66045; H01L 29/66969; H01L 29/1606; H01L 29/24; H01L 29/778; H01L 29/78681
USPC ....................................................... 257/401
See application file for complete search history.

(56) References Cited

U.S. PATENT DOCUMENTS

2014/0252369 A1* 9/2014 Lee .................. H01L 29/66462
                                                                257/76
2018/0040737 A1* 2/2018 Nam ................ H01L 29/78681

* cited by examiner

*Primary Examiner* — Theresa T Doan
(74) *Attorney, Agent, or Firm* — ScienBiziP, P.C.

(57) ABSTRACT

An FET, a method for manufacturing such FET, and an integrated circuit are disclosed. The FET includes a substrate carrying a gate electrode, a gate dielectric layer, and a channel layer sequentially stacked on the substrate. An insulating layer, an etching stop layer, and a protective layer are stacked sequentially on the channel layer. Source and drain electrodes are also formed. A material of the channel layer includes a 2D material. The FET defines two through holes extending through the insulating layer, the etching stop layer, and the protection layer and the channel layer is exposed, the two through holes carry the source and drain electrodes to form a top or direct contact with the channel layer.

20 Claims, 7 Drawing Sheets

FIELD EFFECT TRANSISTOR, PREPARATION METHOD THEREOF AND INTEGRATED CIRCUIT

FIELD

The subject matter herein generally relates to semiconductor technology, specifically to a field effect transistor (FET), a method for preparing the FET, and an integrated circuit using the FET.

BACKGROUND

Two-dimensional (2D) materials have, in atomic terms, ultra-thin thickness, which effectively avoids short channel effects. Therefore, 2D materials are considered to be very suitable as channel materials for FETs. However, due to influence of metal-induced gap states (MIGS), a strong Fermi level pinning effect occurs at interfaces between metal contacts and 2D materials (such as at an interface between a metal source electrode and 2D materials channel, or an interface between a metal drain electrode and 2D materials channel), which limits performance of 2D semiconductor transistors.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
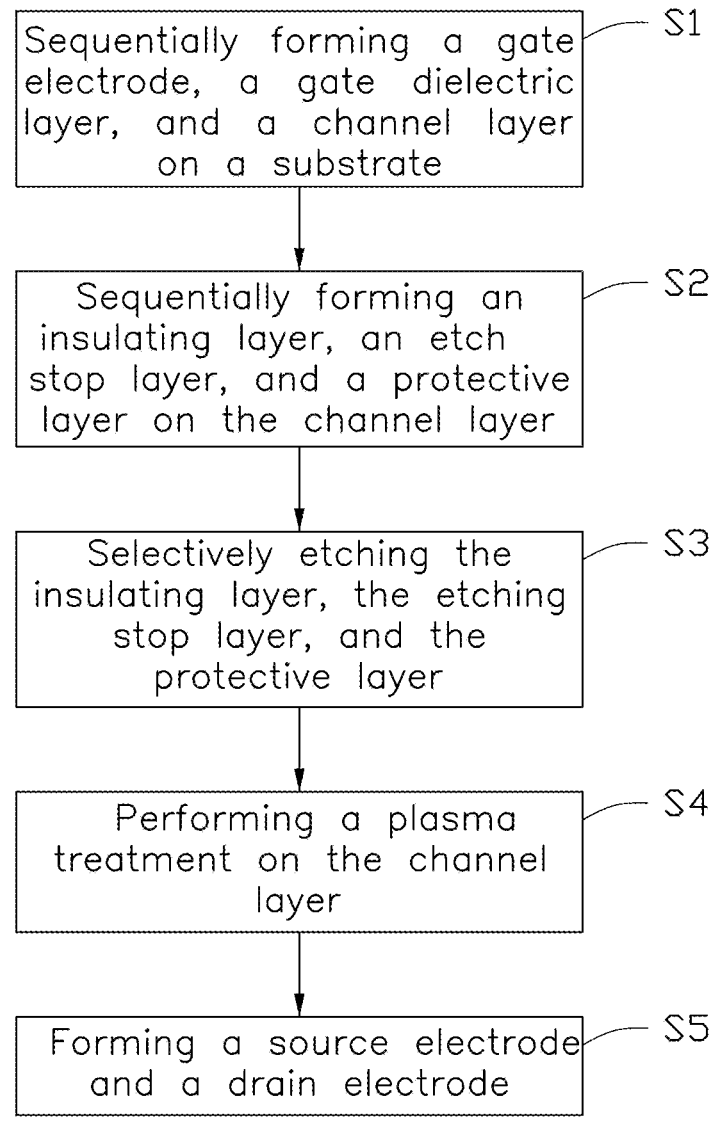
FIG. 1 is a flow chart of a method of manufacturing an FET according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

FIG. 1 is a flow chart of a method for manufacturing an FET. The example method is provided by moray of example, as there are a variety of ways to carry out the method. Each block shown in FIG. 1 represents one or more processes, methods, or subroutines carried out in the example method. Furthermore, the illustrated order of blocks is by example only, and the order of the blocks can be changed. Additional blocks can be added, or fewer blocks can be utilized, without departing from this disclosure. The example method can begin at block S1.

In block S1, a gate electrode, a gate dielectric layer, and a channel layer are sequentially formed on a substrate.

In block S2, an insulating layer, an etching stop layer, and a protective layer are sequentially formed on the channel layer.

In block S3, the insulating layer, the etching stop layer, and the protective layer are selectively etched.

In block S4, the channel layer is treated by plasma.

In block S5, a source electrode and a drain electrode are formed.

The method is described with reference to FIGS. 2 through 6. The FET prepared by this method is a back gate FET. It should be noted that additional operations may be provided before, during, and after the manufacturing processes shown in FIGS. 2 to 6.

In block S1, a gate electrode, a gate dielectric layer, and a channel layer are sequentially formed on a substrate.

Figure 2:
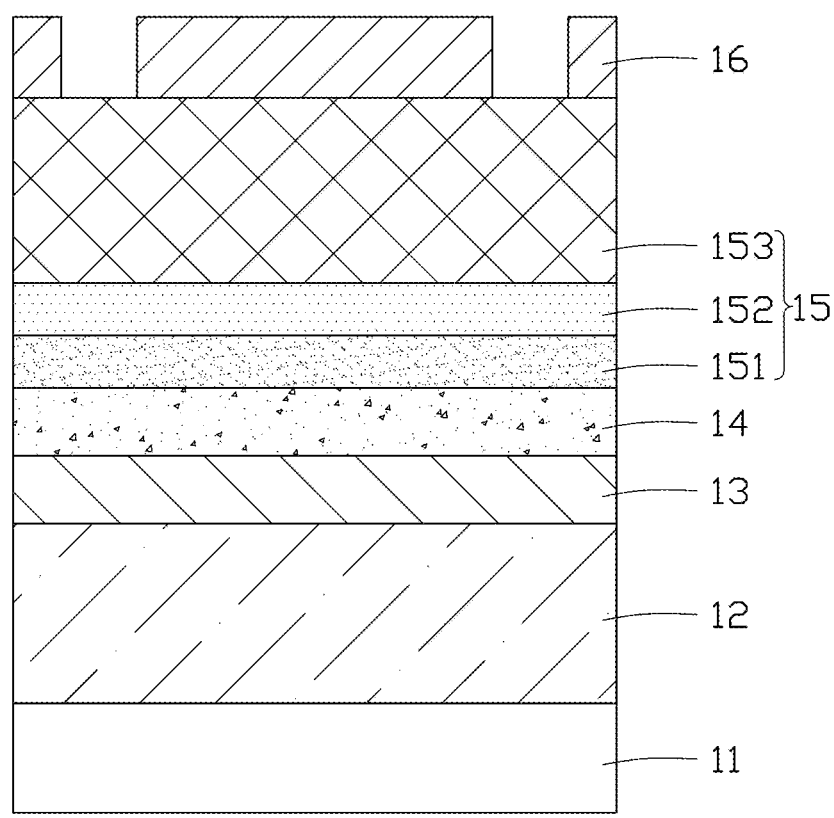
FIG. 2 is a cross-sectional view of a patterned photoresist layer formed on a protective layer of the FET.

As shown in FIG. 2, a gate electrode 12 is formed on a substrate 11. A gate dielectric layer 13 covers a side of the gate electrode 12 away from the substrate 11. A channel layer 14 is on the gate dielectric layer 13. A material of the substrate 11 is, for example, one of silicon, germanium silicon, strained silicon, sapphire, silicon carbide, gallium nitride, gallium arsenide, zinc oxide, aluminum nitride, metal, metalloid, and so on.

A material of the gate electrode 12 is doped polysilicon with uniform or an uneven doping concentration, and the dopant may also include metals, such as one of aluminum, copper, tungsten, titanium, cobalt, nickel, tantalum, titanium nitride, titanium aluminum, aluminum nitride and tantalum nitride. The gate electrode 12 can be obtained by, forming an electrode layer by, for example, chemical vapor deposition (CVD), physical vapor deposition (PVD), atomic layer deposition (ALD) or a combination thereof, and then patterning the electrode layer. The electrode layer can be patterned by photolithography.

In other embodiments, the substrate 11 and the gate electrode 12 are an integrated structure. That is, the substrate 11 and the gate electrode 12 are not formed as two material layers, but are formed by one material layer, which avoids multiple epitaxies and ensures non-boundary characteristics (that is, high quality) of interface between the substrate 11 and the gate electrode 12. A material of the integrated structure can be selected from silicon, germanium silicon, strained silicon, sapphire, silicon carbide, gallium nitride, gallium arsenide, zinc oxide, aluminum nitride, metal, or metalloid, and so on.

A material of the gate dielectric layer 13 is selected from a group consisting of silicon oxide, silicon nitride, silicon oxynitride, and high-K materials. The high-K materials are selected from a group consisting of $HfO_2$, HfSiO, HfSiON, HfLaO, HfTiO, HfZrO, $Al_2O_3$, $La_2O_3$, $ZrO_2$ and LaAlO. The gate dielectric layer 13 may be a single-layer or a multi-layer including the above-mentioned materials, and the above-mentioned materials may be formed by, for example, CVD, PVD, ALD, or a combination thereof.

A material of the channel layer 14 includes a 2D material. The 2D material is selected from a group consisting of graphene, black phosphorus, and 2D transition metal dichalcogenides (TMDs). A 2D material refers to materials in which electrons can move freely in two dimensions only (in planar motion) on a nanometer scale (1 nm to 100 nm). 2D TMDs have atomic thickness and large band gap (in a range from 2.4 eV to 1.8 eV)), so 2D TMDs are very suitable as channel materials for FETs. A general formula of 2D TMDs is $MX_2$. M is a transition metal, such as molybdenum (Mo), tungsten (W), palladium (Pd), platinum (Pt), niobium (Nb) and tantalum (Ta). X is a chalcogenide element, such as sulfur (S), selenium (Se), and tellurium (Te). In other words, the material of the channel layer 14 may include one or more of graphene, black phosphorous, $MoS_2$, $WS_2$, $MoSe_2$, $WSe_2$, $MoTe_2$, $WTe_2$, $PtSe_2$, and the like. In TMDs, $MoS_2$ has high carrier mobility and optical transparency. In some embodiments, a monolayer of $MoS_2$ is formed by CVD as the channel layer 14, and the obtained FET has an ultra-high carrier mobility of 60 $cm^2V^{-1}s^{-1}$. In addition, better electrostatic control is possible in FETs made with TMDs compared to silicon-based FETs. Therefore, a TMD FET is less affected by short-channel effects (SCE). Additionally, a monolayer TMD (with a thickness of about 0.6 nm) has a naturally passivated surface and low surface roughness.

The following describes $MoS_2$ taken as the material of the channel layer 14 of the FET as an example.

In block S2, an insulating layer, an etching stop layer, and a protective layer are sequentially formed on the channel layer.

As shown in FIG. 2, an insulating layer 151, an etching stop layer 152 and a protective layer 153 are sequentially stacked on the channel layer 14.

In some embodiments, a material of the insulating layer 151 includes boron nitride (BN), a material of the etching stop layer 152 includes silicon nitride (SiN), and a material of the protective layer 153 includes silicon oxide ($SiO_2$). The insulating layer 151, the etching stop layer 152, and the protective layer 153 are stacked on the channel layer 14 (stack 15). In subsequent plasma treatment steps, the stack 15 shields the channel layer 14 below it, avoiding damage to large areas to the channel layer 14 by plasma charges.

In addition, since the insulating layer 151 made of BN is greatly stressed in compression and a thin thickness, it is necessary to form a thick protective layer 153 made of $SiO_2$ on the BN to prevent the channel layer 14 from plasma-damage over large areas.

In block S3, the insulating layer, the etching stop layer, and the protective layer are selectively etched.

Specifically, the block S3 includes patterning the protective layer 153 by chemical etching to form two openings 1532. Each opening 1532 extends through the protective layer 153 and exposes the etching stop layer 152. The block S3 further includes patterning the etching stop layer 152 and the protective layer 153 by method of atomic layer etching (ALE) to form through holes 17 exposing the channel layer 14 at the two openings 1532.

Figure 3:
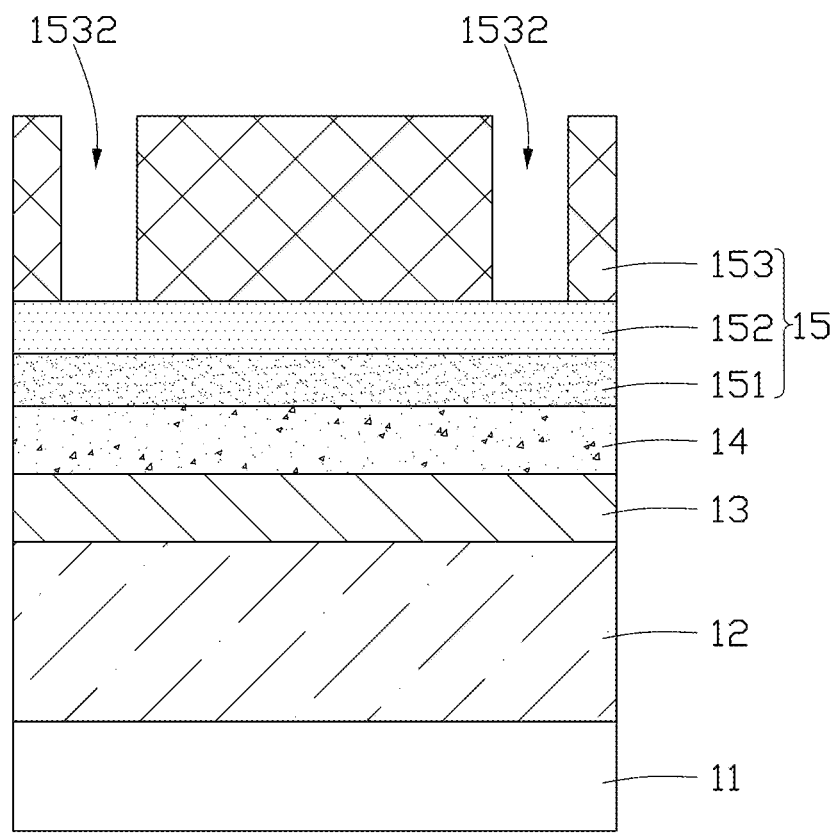
FIG. 3 is a cross-sectional view of two openings formed on the protective layer.

As shown in FIG. 2, in the step of chemical etching, a patterned photo resist layer 16 is formed on the stack 15 (that is, on the protective layer 153). Then, by selective etching, the protective layer 153 is patterned to form the two openings 1532 extending through the protective layer 153 and exposing the etching stop layer 152, as shown in FIG. 3. In other words, $SiO_2$ etching has less effect on SiN, etching removes part of $SiO_2$, but only a small amount of SiN is removed. The step of chemical etching stops at the etching stop layer 152 which is formed of SiN.

Figure 4:
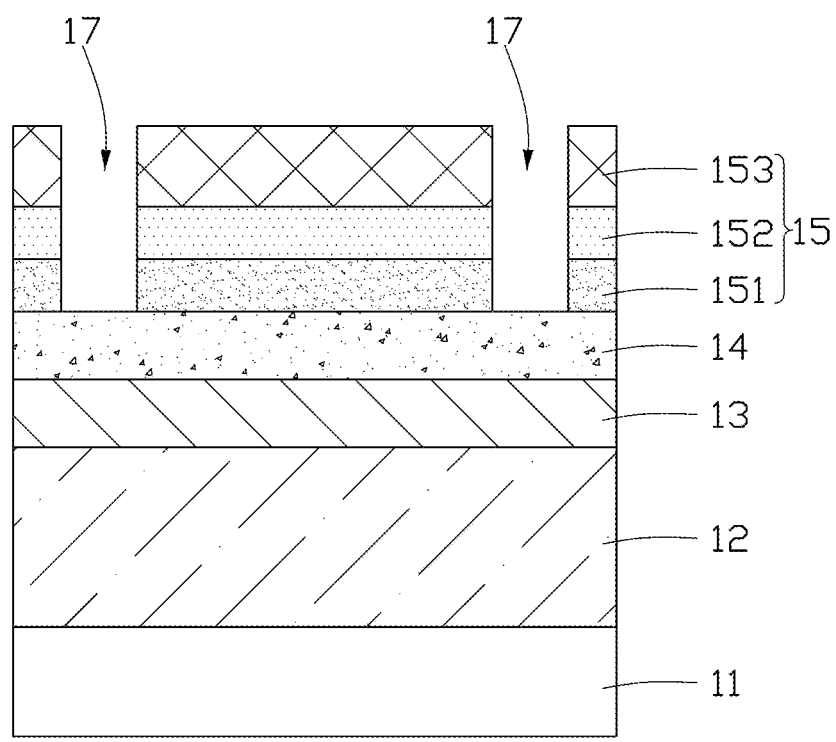
FIG. 4 is a cross-sectional view of a through hole exposing a channel layer on a stack of an insulating layer, an etching stop layer, and a protective layer in the FET.

As shown in FIG. 3 and FIG. 4, there is no immunity for $SiO_2$ in the steps of pattern etching stop layer 152 and protective layer 153 by ALE. In this step, the protective layer 153 made of $SiO_2$ is also partially damaged, and the openings 1532 extend through the etching stop layer 152 and the protective layer 153 to form the through holes 17.

Specifically, ALE uses plasma atomic layer etching technology, the etching being done by bombardment (high-energy ions or neutral particles such as light argon plasma) to avoid direct etching of the etching stop layer 152 and the protective layer 153 from being etched through the channel layer 14 and excessive damage being caused to the surface of the channel layer 14.

In block S4, the channel layer is treated by plasma.

Figure 5:
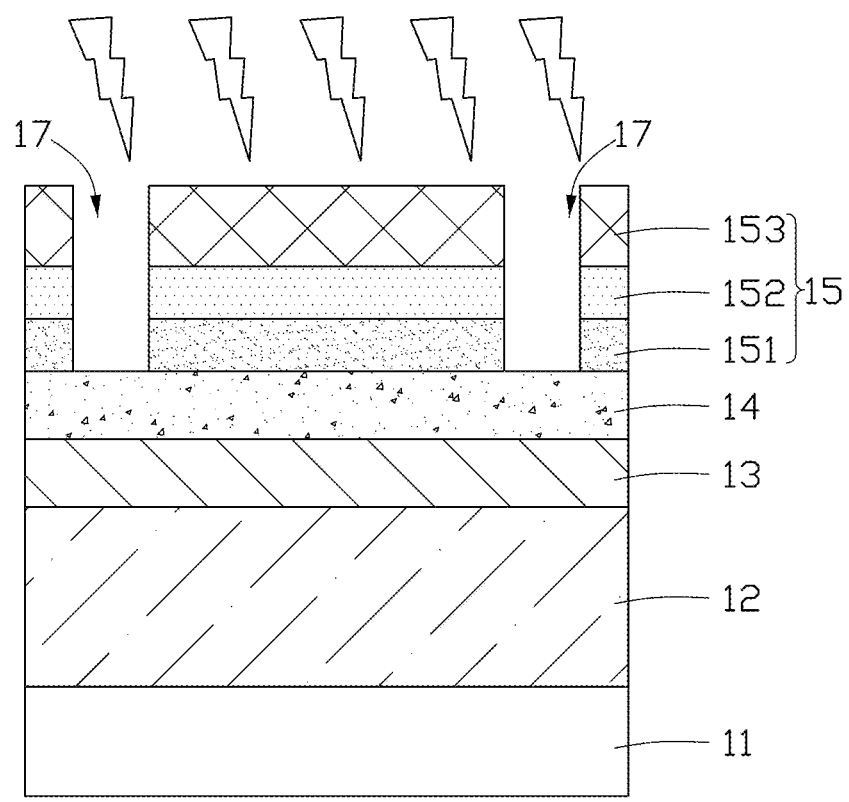
FIG. 5 is a cross-sectional view of a plasma treatment performed on the channel layer in the FET.

As shown in FIG. 5, part of the channel layer 14 exposed by the two through holes 17 is treated by plasma to remove dangling bonds on the surface which is formed after the etching of the channel layer 14. This avoids Fermi level pinning effect at the interface between the metal electrodes (the source electrode 181 and the drain electrode 182) in contact with the channel layer 14 (that is, the surface of the channel layer 14 exposed by the through holes 17, as shown in dashed frame in FIG. 5). A metal-to-semiconductor contact interface with no Fermi level pinning-free is formed. Schottky barrier height (SBH) caused by strong Fermi level pinning effect is insensitive to metal work function, and causing poor contact interface and bonding, is avoided.

In some embodiments, the channel layer is treated by $O_2$ plasma treatment or $N_2$ plasma. Molybdenum disulfide ($MoS_2$) is composed of a sulfur (S)-molybdenum (Mo)-sulfur (S) sandwich layer formed by two layers of sulfur (S) atoms and one layer of molybdenum (Mo) atoms. Different S—Mo—S layers interact with each other by van der Waals force. In the step of atomic layer etching, sulfur (S) may be etched away, resulting in dangling bonds on molybdenum (Mo). In the step of $O_2$ plasma treatment or $N_2$ plasma treatment, dangling bonds formed on molybdenum (Mo) can combine with oxygen ions in $O_2$ plasma or N ions in $N_2$ plasma to form Mo—O or Mo—N. In some embodiments, since properties of oxygen and sulfur are similar, $O_2$ plasma is selected to treat an $MoS_2$ channel layer 14.

In addition, since the portion of the channel layer 14 between the two through holes 17 (that is, the portion used to form the channel) is covered by the insulating layer 151, the etching stop layer 152, and the protective layer 153, the plasma charges in the plasma treatment step do not damage the channel of the FET. In other words, in the plasma treatment step, the contact interface can be combined with oxygen or nitrogen in the plasma, which reduces dangling bonds on the surface of $MoS_2$. Since the insulating layer 151, the etching stop layer 152, and the protective layer 153 protect the channel, surface damage to the channel formed by the $MoS_2$ directly by the plasma charges is minimal, so that original integrity of the 2D channel can be maintained.

In block S5, a source electrode and a drain electrode are formed.

Figure 6:
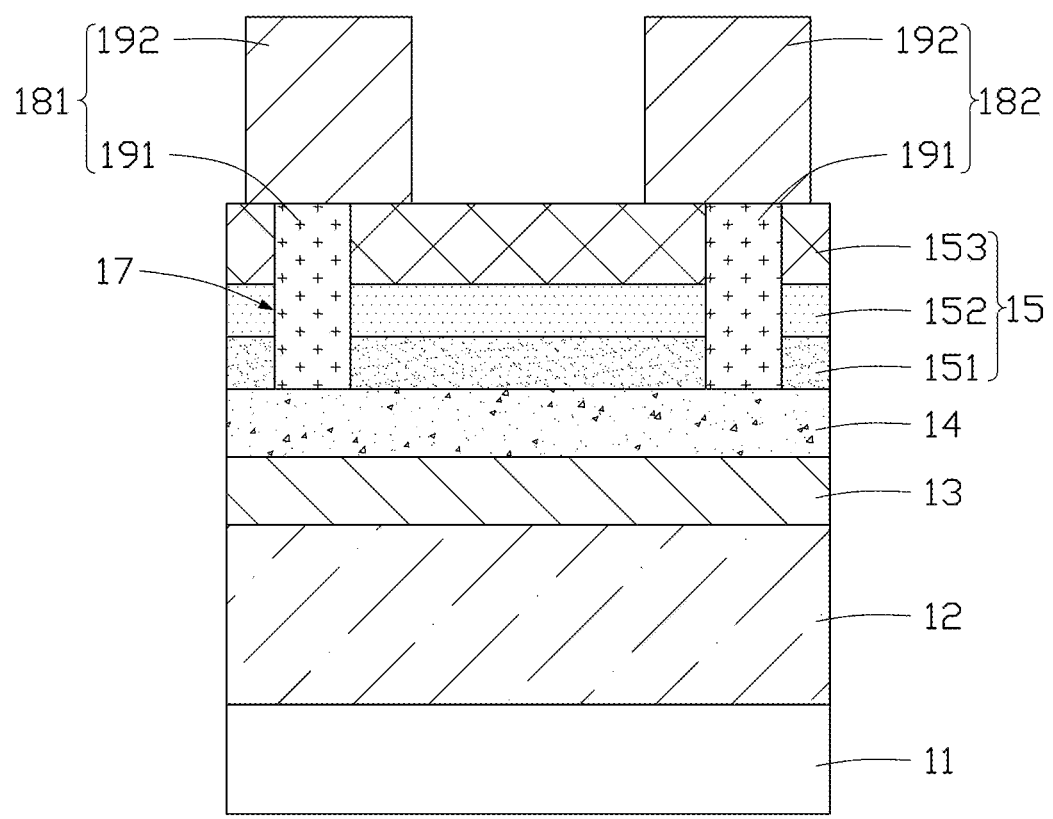
FIG. 6 is a cross-sectional view of the FET after source electrode and drain electrode are formed.

As shown in FIG. 6, the source electrode 181 and the drain electrode 182 are respectively in the two through holes 17 to form top or direct contacts with the channel layer 14, thereby obtaining an FET 10.

In some embodiments, a material of the source electrode 181 is selected from a group consisting of nickel, aluminum, platinum, copper, palladium, gold, titanium, and chromium. A material of the drain electrode 182 is selected from a group consisting of nickel, aluminum, platinum, copper, palladium, gold, titanium, and chromium. When the material of the source electrode 181 or the drain electrode 182 includes the above-mentioned materials, there may be a multi-material and a multi-layer structure.

In FIG. 6, the source electrode 181 includes the stacked first metal layer 191 and a second metal layer 192, and the drain electrode 182 also includes the stacked first metal layer 191 and a second metal layer 192. The first metal layer 191 fills one through hole 17 and forms a top contact with the channel layer 14. The second metal layer 192 is on the first metal layer 191 and partially covers a surface of the protective layer 153. As seen in FIG. 6, the material of the first metal layer 191 is nickel (Ni), and the material of the second metal layer 192 is aluminum (Al). Ni has a work function that matches that of $MoS_2$.

Specifically, the source electrode 181 and the drain electrode 182 may be formed by ALD. Compared with PVD, the ALD does not cause serious plasma-charge damage to the contact interface.

In addition, in some embodiments, in the FET 10, the contact between the metal layer constituting the source electrode 181 and the drain electrode 182 and the semiconductor layer constituting the channel layer 14 is a metal-to-semiconductor top contact, which has a larger contact area, stronger contact bonding, better driving current, and higher reliability than the metal-to-semiconductor side contact (edge contact). The edge contact would mean that the metal layer is deposited in the opening in the semiconductor layer, and a side surface of the metal layer would form a side contact with the semiconductor layer. A thickness of the semiconductor layer is very small, and the interface contact area would be very small in a side contact of the metal-to-semiconductor interface.

In summary, the FET obtained by the method uses a 2D material as the channel layer, which has high electron mobility and avoids short channel effects. In addition, the method stacks an insulating layer, an etching stop layer, and a protective layer on the channel layer, selectively etches the stack, and adds a plasma treatment of the channel layer as a step in the method. Since part of the channel layer 14 used to form a channel is covered by the insulating layer, the etching stop layer, and the protective layer, plasma charges in the plasma treatment step do not damage the 2D channel of the FET. In the plasma treatment step, the plasma charges combine with the dangling bonds on the interface of the channel layer for forming metal-to-semiconductor contacts, thereby reducing the dangling bonds on the contact surface of the channel layer. In addition, in the step of forming the source and drain electrodes, ALD improves the bonding strength of the metal-to-semiconductor interface and avoids damage to the interface by PVD. Thus, Fermi level pinning from multiple aspects is avoided (e.g., direct chemical etching affecting the contact interface is avoided, and impact of PVD on the contact interface is also avoided, etc.). A contact interface or channel interface without Fermi level pinning is thus obtained.

In some embodiments, an FET prepared by the above method is also provided. A structure of the FET is as shown in FIG. 6. It can be understood that one FET 10 is schematically drawn in FIG. 6, in some embodiments, the substrate 11 may include a plurality of FETs 10 in an array.

Figure 7:
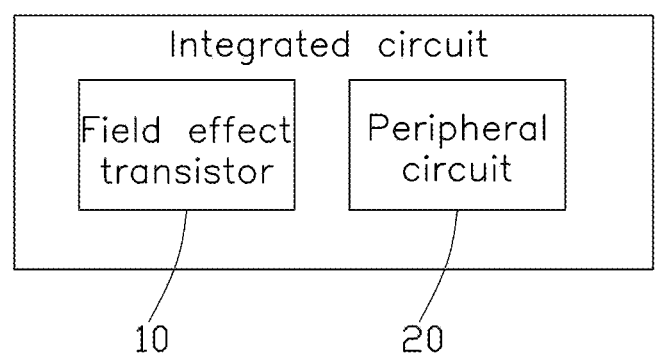
FIG. 7 is a schematic view of an integrated circuit for the FET according to an embodiment.

As shown in FIG. 7, in some embodiments, an integrated circuit 100 is also provided. The integrated circuit 100 includes a peripheral circuit 20 and the FET 10 electrically connected to the peripheral circuit 20. The peripheral circuit 20 includes, for example, a logic circuit, a memory circuit, and a memory control circuit. The FET 10 is electrically connected to the peripheral circuit 20, which improves the stability of the integrated circuit 100. The integrated circuit 100 can be formed with critical nanometer-scale sizes (for example, process nodes of 3 nm, 5 nm, 7 nm, 10 nm, 14 nm, 22 nm, or smaller nano process nodes), and has a high integration density.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method for manufacturing a field effect transistor (FET), comprising:
   sequentially forming a gate electrode, a gate dielectric layer, and a channel layer on a substrate, wherein the gate electrode is closer to the substrate than the channel layer, and the channel layer is made of a two-dimensional (2D) material;
   sequentially forming an insulating layer, an etching stop layer and a protective layer on the channel layer, wherein the insulating layer is in direct contact with the channel layer and is electrically insulated;
   selectively etching the insulating layer, the etching stop layer, and the protective layer to form two through holes, the two through holes extending through the insulating layer, the etching stop layer, and the protective layer and exposing the channel layer;
   performing a plasma treatment on the channel layer; and
   forming a source electrode and a drain electrode, wherein the source electrode and the drain electrode are respectively in a corresponding one of the two through holes and form a top contact with the channel layer.

2. The method for manufacturing an FET of claim 1, wherein selectively etching the insulating layer, the etching stop layer, and the protective layer comprises:
   patterning the protective layer by chemical etching to form two openings extending through the protective layer and exposing the etching stop layer; and
   patterning the etching stop layer and the protective layer by atomic layer etching to form the two through holes exposing the channel layer at the two openings.

3. The method for manufacturing an FET of claim 1, wherein the source electrode and the drain electrode are formed by atomic layer deposition.

4. The method for manufacturing an FET of claim 1, wherein the plasma treatment is $O_2$ plasma treatment or $N_2$ plasma treatment.

5. The method for manufacturing an FET of claim 1, wherein the 2D material is selected from a group consisting of graphene, black phosphorus, and 2D transition metal chalcogenides, a general formula of the 2D transition metal chalcogenides is $MX_2$, M is one of molybdenum, tungsten, palladium, platinum, niobium, and tantalum, and X is one of sulfur, selenium, and tellurium.

6. The method for manufacturing an FET of claim 1, wherein a material of the insulating layer comprises boron nitride, a material of the etching stop layer comprises silicon nitride, and a material of the protective layer comprises silicon oxide.

7. A field effect transistor (FET), comprising:
   a substrate;
   a gate electrode, a gate dielectric layer, and a channel layer sequentially stacked on the substrate, wherein the channel layer is made of a two-dimensional (2D) material, and the gate electrode is closer to the substrate than the channel layer;
   an insulating layer, an etching stop layer, and a protective layer sequentially stacked on the channel layer, wherein the insulating layer is in direct contact with the channel layer and is electrically insulated, and the FET defines two through holes extending through the insulating layer, the etching stop layer, and the protective layer and exposing the channel layer; and
   a source electrode and a drain electrode respectively in a corresponding one of the two through holes and forming a top contact with the channel layer.

8. The FET of claim 7, wherein the 2D material is selected from a group consisting of graphene, black phosphorus, and 2D transition metal chalcogenides, a general formula of the 2D transition metal chalcogenides is $MX_2$, M is one of molybdenum, tungsten, palladium, platinum, niobium, and tantalum, and X is one of sulfur, selenium, and tellurium.

9. The FET of claim 7, wherein a material of the insulating layer comprises boron nitride, a material of the etching stop layer comprises silicon nitride, and a material of the protective layer comprises silicon oxide.

10. The FET of claim 7, wherein a material of the source electrode is selected from a group consisting of nickel, aluminum, platinum, copper, palladium, gold, titanium, and chromium; a material of the drain electrode is selected from a group consisting of nickel, aluminum, platinum, copper, palladium, gold, titanium, and chromium.

11. The FET of claim 7, wherein each of the source electrode and the drain electrode comprises a first metal layer in the corresponding one of the two through holes and forming the top contact with the channel layer, and a second metal layer on the first metal layer and partially covering a surface of the protection layer.

12. The FET of claim 11, wherein the channel layer is made of molybdenum disulfide, the first metal layer is made of nickel.

13. The FET of claim 7, wherein a material of the gate dielectric layer is selected from a group consisting of silicon oxide, silicon nitride, silicon oxynitride, and high-K materials.

14. The FET of claim 13, wherein high-K materials are selected from a group consisting of $HfO_2$, HfSiO, HfSiON, HfLaO, HfTiO, HfZrO, $Al_2O_3$, $La_2O_3$, $ZrO_2$ and LaAlO.

15. An integrated circuit, comprising a peripheral circuit and at least one FET electrically connected to the peripheral circuit, the at least one FET comprising:
    a substrate;
    a gate electrode, a gate dielectric layer, and a channel layer sequentially stacked on the substrate, wherein the channel layer is made of a two-dimensional (2D) material, and the gate electrode is closer to the substrate than the channel layer;
    an insulating layer, an etching stop layer, and a protective layer sequentially stacked on the channel layer, wherein the insulating layer is electrically insulated and in direct contact with the channel layer, and the FET defines two through holes extending through the insulating layer, the etching stop layer, and the protective layer and exposing the channel layer; and
    a source electrode and a drain electrode respectively in a corresponding one of the two through holes and forming a top contact with the channel layer.

16. The integrated circuit of claim 15, wherein the 2D material is selected from a group consisting of graphene, black phosphorus, and 2D transition metal chalcogenides, a general formula of the 2D transition metal chalcogenides is $MX_2$, M is one of molybdenum, tungsten, palladium, platinum, niobium, and tantalum, and X is one of sulfur, selenium, and tellurium.

17. The integrated circuit of claim 15, wherein a material of the insulating layer comprises boron nitride, a material of the etching stop layer comprises silicon nitride, and a material of the protective layer comprises silicon oxide.

18. The integrated circuit of claim 15, wherein a material of the source electrode is selected from a group consisting of nickel, aluminum, platinum, copper, palladium, gold, titanium, and chromium; a material of the drain electrode is selected from a group consisting of nickel, aluminum, platinum, copper, palladium, gold, titanium, and chromium.

19. The integrated circuit of claim 15, wherein each of the source electrode and the drain electrode comprises a first metal layer in the corresponding one of the two through holes and forming the top contact with the channel layer, and a second metal layer on the first metal layer and partially covering a surface of the protection layer; the channel layer is made of molybdenum disulfide, the first metal layer is made of nickel.

20. The integrated circuit of claim 15, wherein a material of the gate dielectric layer is selected from a group consisting of silicon oxide, silicon nitride, silicon oxynitride, and high-K materials.

* * * * *